United States Patent
Quet

(10) Patent No.: US 8,635,037 B2
(45) Date of Patent: Jan. 21, 2014

(54) BATTERY STATE-OF-CHARGE MANAGEMENT METHOD

(75) Inventor: Pierre-Francois Quet, Somerville, MA (US)

(73) Assignee: Nuvera Fuel Cells, Inc., Billerica, MA (US)

( * ) Notice: Subject to any disclaimer, the term of this patent is extended or adjusted under 35 U.S.C. 154(b) by 278 days.

(21) Appl. No.: 12/907,902

(22) Filed: Oct. 19, 2010

(65) Prior Publication Data

US 2011/0093223 A1 Apr. 21, 2011

Related U.S. Application Data

(60) Provisional application No. 61/253,013, filed on Oct. 19, 2009, provisional application No. 61/259,813, filed on Nov. 10, 2009.

(51) Int. Cl.
*G01R 31/36* (2006.01)
*G01R 21/00* (2006.01)
*G01R 21/06* (2006.01)
*H02J 7/00* (2006.01)

(52) U.S. Cl.
USPC .............................. 702/63; 320/132; 702/60

(58) Field of Classification Search
USPC ........ 702/60, 63; 320/101, 104, 132; 324/427
See application file for complete search history.

(56) References Cited

U.S. PATENT DOCUMENTS

| | | | |
|---|---|---|---|
| 6,326,763 B1 | 12/2001 | King et al. | |
| 6,534,954 B1 * | 3/2003 | Plett .............................. | 320/132 |
| 7,486,079 B2 * | 2/2009 | Yumoto et al. ................ | 324/427 |
| 7,561,978 B2 * | 7/2009 | Koch et al. ...................... | 702/63 |
| 7,701,175 B2 * | 4/2010 | Rauchfuss .................... | 320/132 |
| 8,035,345 B2 * | 10/2011 | Plett .............................. | 320/132 |
| 8,046,181 B2 * | 10/2011 | Kang et al. ...................... | 702/63 |
| 8,319,479 B2 * | 11/2012 | Kao et al. ...................... | 320/157 |
| 8,332,169 B2 * | 12/2012 | Kang et al. ...................... | 702/63 |
| 8,368,346 B2 * | 2/2013 | Batson et al. ................. | 320/103 |
| 2004/0079564 A1 | 4/2004 | Tabata | |
| 2005/0095471 A1 * | 5/2005 | Winstead ........................ | 429/13 |

(Continued)

FOREIGN PATENT DOCUMENTS

| | | | |
|---|---|---|---|
| JP | 2003 324853 A | 11/2003 | |
| JP | 2004 335343 A | 11/2004 | |

(Continued)

OTHER PUBLICATIONS

International Search Report and Written Opinion mailed Jan. 27, 2011, for International Application No. PCT/US2010/053239 filed Oct. 19, 2010, 11 pages.

Roscher, M.A. et al., "Dynamic electric behavior and open-circuit-voltage modeling of LiFePO4-based lithium ion secondary batteries", *Journal of Power Sources*, Elsevier, SA, CH, vol. 196, No. 1, Jul. 7, 2010, pp. 331-336, XP027261337, ISSN: 0378-7753, Section 4.3.

*Primary Examiner* — Alexander H Taningco
*Assistant Examiner* — Yaritza H Perez Bermudez
(74) *Attorney, Agent, or Firm* — Finnegan, Henderson, Farabow, Garrett & Dunner, LLP

(57) ABSTRACT

Equipment and methods for estimating and regulating the state of charge (SOC) of a battery in a hybrid fuel cell-battery system for use in a moving vehicle. The SOC is continuously estimated and the fuel cell power is regulated to maintain the SOC at a level such that the battery has enough stored energy to operate motors used in the vehicle, and enough spare capacity to accept regenerative energy from these motors during further operations.

20 Claims, 5 Drawing Sheets

(56) References Cited

U.S. PATENT DOCUMENTS

2006/0029846 A1* 2/2006 Konoto et al. .................. 429/23
2006/0220619 A1* 10/2006 Namba et al. ................ 320/149
2007/0051223 A1* 3/2007 Sugimoto et al. ................ 84/2
2009/0246631 A1* 10/2009 Hojo et al. .................... 429/213

FOREIGN PATENT DOCUMENTS

| JP | 2005 005009 A | | 1/2005 |
| JP | 2005005009 A | * | 1/2005 |
| WO | WO 2006/057468 A1 | | 6/2006 |
| WO | WO 2008/004564 A1 | | 1/2008 |

* cited by examiner

| Parameter | Value |
|---|---|
| Battery Ahr rating | 97 Ahr |
| Discharging coeff | 0.003 |
| Charging coeff | 0.4 |
| $V_{oc}$Offset | 35.3 V |
| $V_{oc}$Slope | 3.12 V |
| $R_{Series}$ | 0.02 Ω |
| L | 0.001 |
| $T_s$ | 0.2 s |
| $SOC_{SP}$ | 90 % |
| SOC Ctrl Time Constant | 50 s |
| $I_{FC_{min}}$ | 50 A |
| $I_{FC_{max}}$ | 220 A |

Figure 4

BATTERY STATE-OF-CHARGE MANAGEMENT METHOD

This application claims priority to U.S. Provisional Application No. 61/253,013, filed Oct. 19, 2009, and U.S. Provisional Application No. 61/259,813, filed Nov. 10, 2009, both of which are incorporated by reference in their entirety.

Electric vehicles powered by batteries, such as forklift trucks and golf carts, are frequently used in manufacturing, wholesale and retail operations for transporting and/or lifting of people and products. However, these electric vehicles can have shortcomings. For example, a forklift truck must be recharged every six to eight hours, requiring warehouse space for spare batteries and charging equipment. Moreover, the performance of the vehicle progressively decreases as the batteries get depleted.

In contrast, fuel cell powered electric vehicles can be quickly refilled, maintain their performance over a shift, and allow cost savings by eliminating the need to reserve valuable warehouse space for battery storage and charging equipment. The hybrid fuel cell system described herein can address at least one of these benefits.

A hybrid fuel cell system used herein refers to a system comprising a fuel cell and a battery. The term "battery" used herein broadly refers to a device that can repeatedly store and dispense electric power, including but not limited to chemical batteries (e.g., a lead-acid battery, a lithium ion battery, a nickel-metal hydride battery, a nickel-cadmium battery) and ultra capacitors.

In the hybrid power system, the fuel cell supplies power to the motors and to the battery during normal operation. The battery buffers electric demand, supplementing the fuel cell power at peak load and absorbing regenerative energy. For fork lifts, for example, the management of the state-of-charge ("SOC") of this battery is important, as the battery should contain enough energy to meet the peak electrical demand of the traction and lift motors, but must also not be fully charged so that it can accept regenerative energy when the vehicle undergoes regenerative events, such as braking or lowering a load. If the battery SOC is too high during regenerative events, the battery voltage can rise to an unsafe level that may damage the battery, the motors, or the motors' controllers, thereby causing system failures and shutdowns.

The management of the battery SOC typically requires a SOC estimate, as direct measurement of the SOC is often impractical. It is known in the art to use a current integration method (also called Coulomb counting) to obtain a SOC estimate of a battery. However, this method suffers from long term drift that renders the SOC estimate inaccurate over time.

The present disclosure provides a method that uses the battery voltage and the battery current to obtain a SOC estimate. The estimator in this disclosure is a Luenberger observer based on a model derived from an electrical equivalent circuit of the battery. In certain embodiments, the SOC estimate is then used by a regulator that throttles the fuel cell power to maintain the SOC at a level that is such that the battery has enough stored energy to supply the traction and lift motors, and enough spare capacity to accept regenerative energy from these motors.

Accordingly, one embodiment of the present invention is directed to a method for managing the state of charge of a battery in a hybrid electric power system comprising a battery and a fuel cell, the method comprising: defining a setpoint; estimating the present state of charge of the battery using the battery current and the battery voltage; and regulating the state of charge of the battery by manipulating a fuel cell current supplied from the fuel cell to the battery based on the difference between the setpoint and the estimated present state of charge of the battery. This embodiment can maintain the battery state-of-charge at the setpoint.

BRIEF DESCRIPTION OF DRAWINGS

FIG. 4 is a table with values of parameters according to one embodiment of this disclosure.

DETAILED DESCRIPTION

Figure 1:
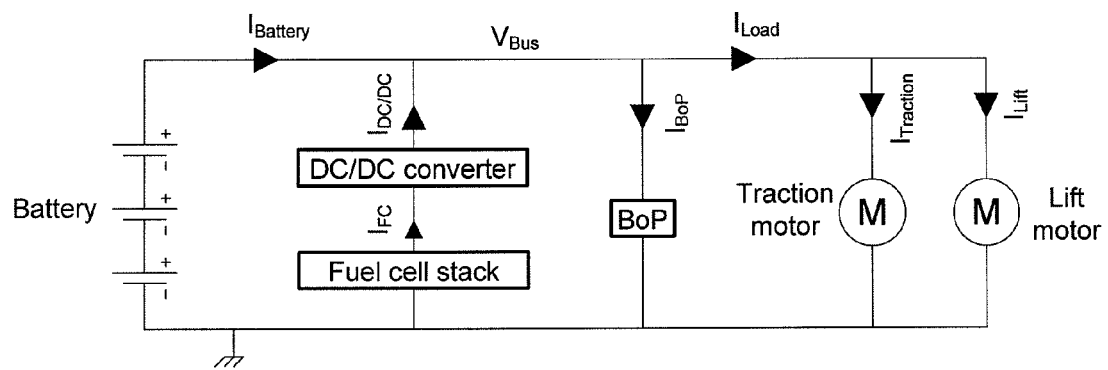
FIG. 1 is a schematic of an embodiment of a hybrid fuel cell system for use in a forklift truck.

FIG. 1 illustrates a hybrid fuel cell system for use in a forklift truck. Connected in parallel on the same electrical conductor (also called "bus") are the battery pack, the fuel cell stack in series with a DC/DC converter, the balance-of-plant components (BoP), the traction motor, and the lift motor. The BoP typically comprises an air compressor, a water pump, a fan, an electronic control unit, and valves used for hydrogen delivery, water purge and nitrogen purge. The BoP consumes a current of $I_{BoP}$ at a voltage $V_{Bus}$. The fuel cell stack generates a current $I_{FC}$ at a voltage corresponding to the polarization curve of the specific fuel cell. The DC/DC converter regulates the fuel cell voltage to the bus voltage $V_{Bus}$, generating a current $I_{DC/DC}$. The traction motor current $I_{Traction}$ is positive if the truck is accelerating, and negative if the truck is braking. The lift motor current $I_{Lift}$ is positive if the truck is lifting a charge, and negative if it is lowering a charge. The load current $I_{Load}$ is the combination of the traction and the lift motors current:

$$I_{Load} = I_{Traction} + I_{Lift}$$

The battery current $I_{Battery}$ is equal to the load current plus the BoP current minus the DC/DC output current:

$$I_{battery} = I_{Load} + I_{BOP} - I_{DC/DC}. \quad (1)$$

The battery voltage $V_{Bus}$ is made available to the hybrid fuel cell control unit either by direct voltage measurement or sensed by the DC/DC converter and then communicated to the control unit. The battery current $I_{battery}$ can either be measured directly or can be calculated according to Equation (1) based on measured or estimated values for $I_{Load}$, $I_{BOP}$, and $I_{DC/DC}$.

Figure 2:
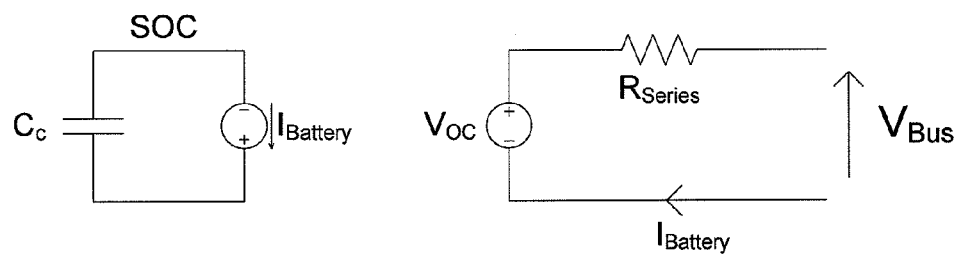
FIG. 2 is an equivalent circuit used to model the battery.

FIG. 2 shows an equivalent circuit used to model the battery.

$C_c$ is a large capacitor that models the battery capacity and is chosen such that SOC=1 for a fully charged battery:

$$C_c = \text{Battery amp hour rating} * 3600$$

The battery capacity is then adjusted to take into account the battery discharging and charging inefficiency:

$$C_c(I_b) = 3600 * \text{Battery amphour rating} * e^{-\text{Discharging coeff} * I_{battery}(k)} \text{ if } I_{battery} \geq 0,$$

$$C_c(I_b) = 3600 * (\text{Battery amphour rating} - \text{Charging coeff} * I_{battery}(k)) \text{ if } I_{battery} < 0.$$

The capacitor $C_c$ is connected in parallel with a current source with current $I_{battery}(k)$, to model the discharging and charging of the battery.

The battery voltage $V_{Bus}$ is modeled as the output of a circuit having a voltage source corresponding to the battery open circuit voltage $V_{oc}$ in series with a resistor $R_{Series}$ that models the impedance of the battery.

The battery open circuit voltage is assumed to have a linear relationship with SOC:

$$V_{oc} = V_{oc}\text{Slope} * \widehat{SOC}(k-1) + V_{oc}\text{Offset}.$$

Accordingly, the battery model is $$\begin{cases} S\dot{O}C = -\dfrac{I_{battery}}{C_c(I_b)} \\ V_{bus} = V_{oc} - R_{Series}I_{battery}, \end{cases} \quad (2)$$

where the dot symbol denotes the time derivative.

The battery model could also include a resistor placed in parallel with $C_c$ to model the battery self-discharge, or have a nonlinear relationship between SOC and $V_{oc}$, or have a network of resistors and capacitors added to the series impedance to more accurately model transients in battery voltage.

Figure 3:
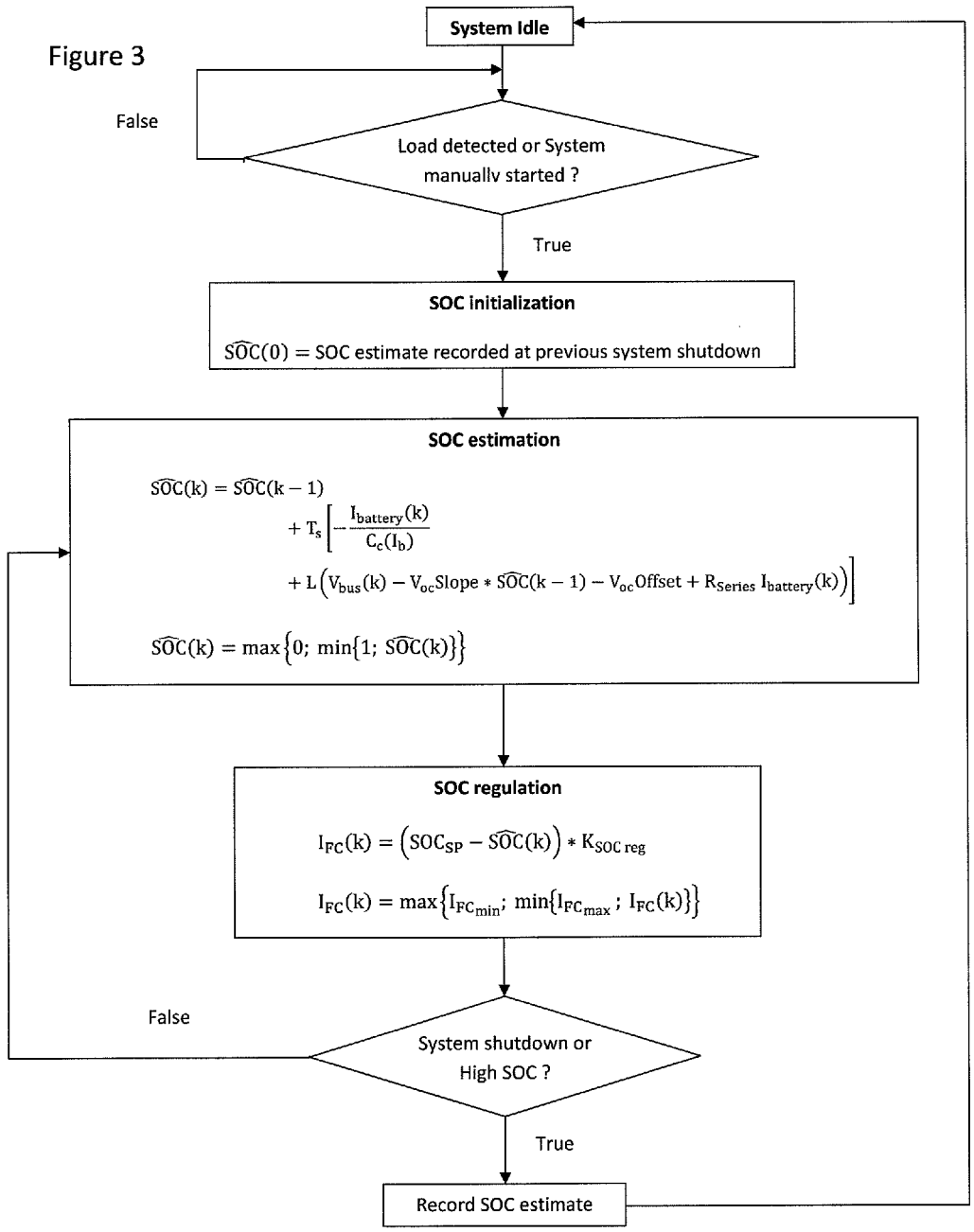
FIG. 3 is a flowchart showing the estimation and control of the battery SOC.

FIG. 3 is a flowchart of the SOC estimation and regulation. Building upon the battery model shown in Equations (2), a Luenberger observer gives an estimate of the SOC based on the measured or calculated battery voltage and current $V_{bus}$ and $I_{battery}$:

$$S\hat{\dot{O}}C = -\dfrac{I_{battery}}{C_c} + L(V_{bus} - \hat{V}_{bus}) \quad (3)$$

where $\hat{V}_{bus} = V_{oc} - R_{Series}I_{battery}$, with $V_{oc} = V_{oc}\text{Slope}*\widehat{SOC} + V_{oc}\text{Offset}$, and where the hat symbol denotes an estimate of the corresponding variable.

The Luenberger observer is known in the art, and the observer gain L can be calculated using various methods including pole placement and Kalman filtering. A Kalman filtering design would assume a process and measurement noise structure to the system dynamics, and give the gain L that would minimize the steady-state error covariance of the system state.

The observer shown in Equation (3) needs to be discretized in order to be implemented on the digital control unit of the hybrid fuel cell system. Assuming a sampling time $T_s$ for the estimation algorithm, and a Euler approximation of the time derivative of $\widehat{SOC}$ $$\left(i.e. \; S\hat{\dot{O}}C \approx \dfrac{S\hat{O}C(k) - S\hat{O}C(k-1)}{T_s}\right),$$

the following discrete implementation of the observer is obtained:

$$S\hat{O}C(k) = S\hat{O}C(k-1) + T_s\left[-\dfrac{I_{battery}(k)}{C_c(I_b)} + L(V_{bus}(k) - V_{oc} + R_{Series}I_{battery}(k))\right]$$

which can also be expressed as follows:

$$S\hat{O}C(k) = S\hat{O}C(k-1) + T_s\left[-\dfrac{I_{battery}(k)}{C_c(I_b)} + L(V_{bus}(k) - V_{oc}\text{Slope}*S\hat{O}C(k-1) - V_{oc}\text{Offset} + R_{series}I_{battery}(k))\right].$$

The SOC estimate is then coerced between 0 and 1:

$$\widehat{SOC}(k) = \max\{0; \min\{1; \widehat{SOC}(k)\}\}.$$

The SOC estimate has its initial value equal to a recorded value of the estimate taken during the previous system shutdown. If the forklift truck is used in a light power consuming mode, or not actively operated, a system shutdown mechanism will be triggered by a threshold high SOC value and cuts off the electric current from the fuel cell, thus preventing the batteries from overcharging. On the other hand, a load detecting mechanism that detects an electric load that draws power from the battery to a threshold value (e.g., $I_{load}$=20 amp and higher) will allow recharge of the battery by restarting the fuel cell system.

The SOC estimate is regulated to a desired setpoint value ($SOC_{SP}$) by manipulating the fuel cell current $I_{FC}$. In the present embodiment, a proportional controller is used for SOC regulation, but other control techniques can be used including but not limited to Proportional-Integral, Proportional-Integral-Derivative, Linear Quadratic Regulator, other classical control methods, modern, nonlinear, robust, optimal, stochastic, adaptive, intelligent. The proportional controller can be expressed as follows:

$$I_{FC}(k) = (SOC_{SP} - \widehat{SOC}(k)) * K_{SOC\,reg}$$

where the control gain $K_{SOC\,reg}$ can be chosen as $$K_{SOC\,reg} = \dfrac{C_c}{SOC\;Ctrl\;\text{Time Constant}}$$

to achieve a closed loop dynamic of the SOC that has approximately a time constant of SOC Ctrl Time Constant seconds.

The fuel cell current setpoint $I_{FC}(k)$ is then coerced between a minimum value $I_{FC_{min}}$ and a maximum value $I_{FC_{max}}$ in order to maximize the fuel cell stack durability:

$$I_{FC}(k) = \max\{I_{FC_{min}}; \min\{I_{FC_{max}}; I_{FC}(k)\}\}.$$

The SOC can also be regulated by manipulating the DC/DC output current $I_{DC/DC}$ instead of manipulating the fuel cell current $I_{FC}$.

Figure 5:
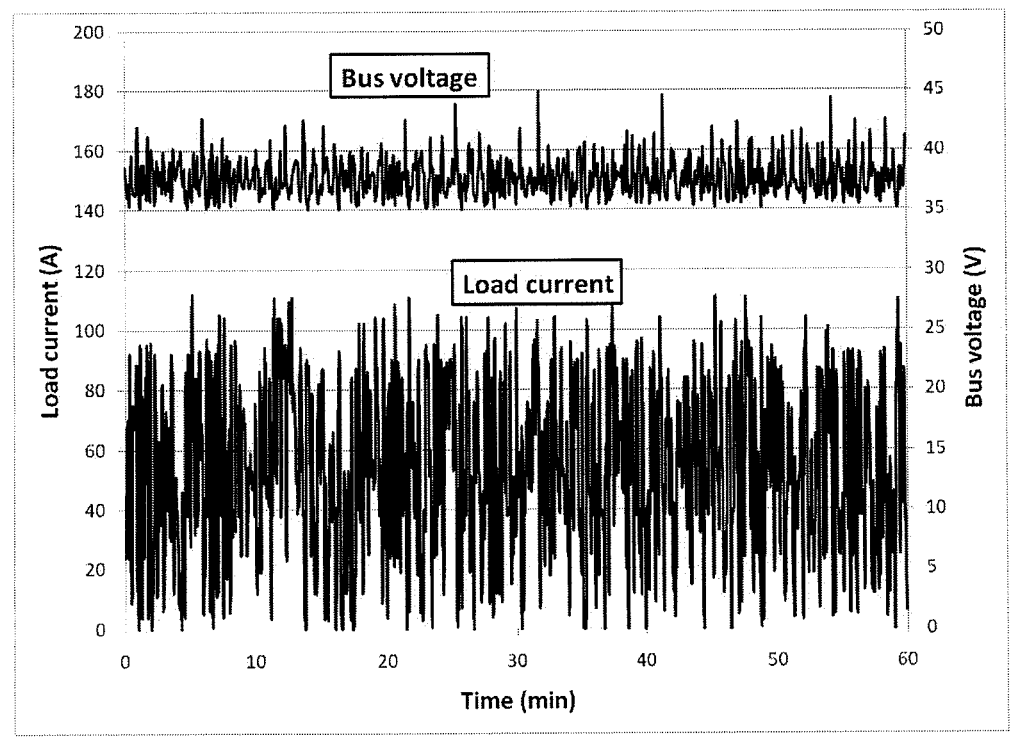
FIG. 5 and FIG. 6 show experimental data from a simulated run of the hybrid power system having battery SOC control.
Figure 6:
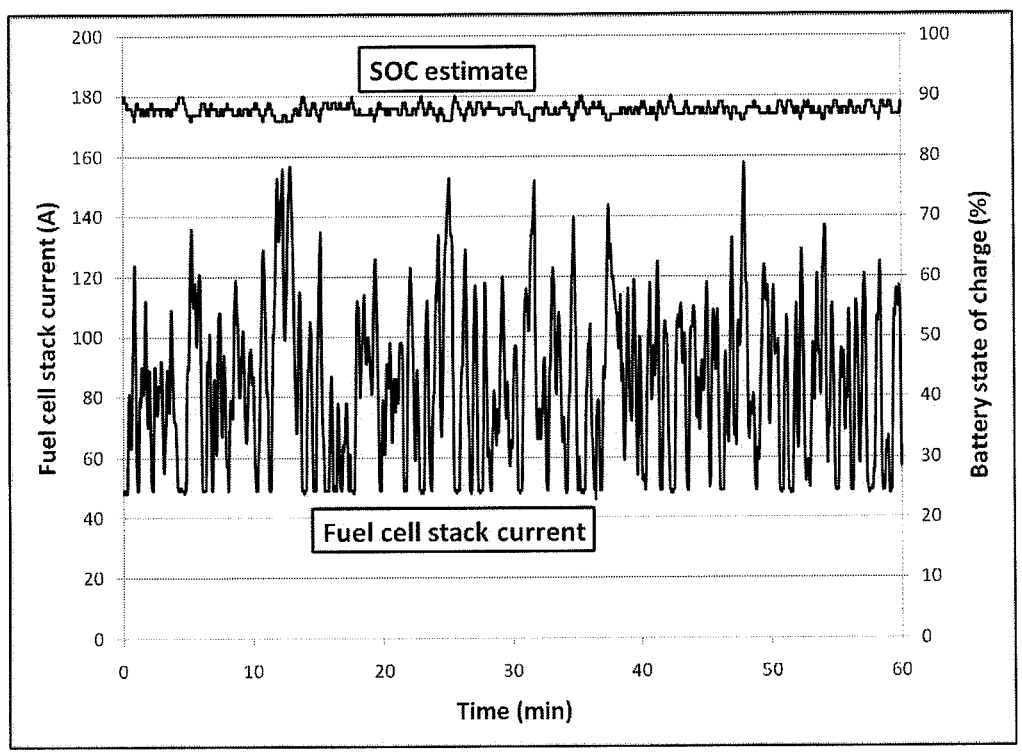

FIG. 5 and FIG. 6 show data collected from a hybrid fuel cell-battery power system under various load conditions simulated by a Dynaload electronic load. FIG. 5 shows the load current $I_{Load}$ and bus voltage $V_{bus}$ while FIG. 6 shows the state of charge estimate $\widehat{SOC}$ and fuel cell current $I_{FC}$. For example, it can be seen from FIG. 6 that the state of charge is successfully maintained within 5% of its setpoint of 90%.

The methods disclosed herein can be applied, for example, in a hybridized forklift truck. However, the methods are applicable to a variety of applications that involve a hybrid fuel cell-battery power system, including auxiliary power units, backup power systems, portable generators, and fuel cell power plants in passenger vehicles.

What is claimed is:

1. A method of managing a state of charge of a battery in a hybrid electric power system comprising a fuel cell, the method comprising:

defining a setpoint;
calculating an estimated present state of charge of the battery according to the following equation:

$$S\hat{O}C(k) = S\hat{O}C(k-1) + T_s\left[-\frac{I_{battery}(k)}{C_c(I_b)} + L(V_{bus}(k) - \hat{V}_{bus}(k))\right]$$

wherein $S\hat{O}C(k)$ is the estimated present state of charge of the battery;
$S\hat{O}C(k-1)$ is a previously estimated state of charge of the battery;
$T_s$ is the time in seconds elapsed since the previously estimated state of charge of the battery was calculated;
$I_{battery}(k)$ is the battery current;
$C_c$ is the battery capacity in Ampere-second;
L is an observer gain;
$V_{bus}(k)$ is the battery voltage; and
$\hat{V}_{bus}$ is an estimate of the battery voltage based on the previous state of charge estimate $S\hat{O}C(k-1)$ and on the measured battery current $I_{battery}(k)$; and
regulating the state of charge of the battery by manipulating a fuel cell current supplied from the fuel cell to the battery based on the difference between the setpoint and the estimated present state of charge of the battery.

2. The method according to claim 1, wherein the regulation of the state of charge of the battery effectively regulates the state of charge of the battery to within a selected range.

3. The method according to claim 2, wherein the regulation of the state of charge of the battery effectively regulates the state of charge of the battery to within 5% of the setpoint.

4. The method according to claim 1, wherein regulation of the state of charge of the battery effectively regulates the state of charge of the battery to the setpoint.

5. The method according to claim 1, wherein the state of charge of the battery is regulated by a control technique chosen from proportional control, proportional-integral control, proportional-integral-derivative control, and linear quadratic control.

6. The method of claim 1, wherein the fuel cell current is set to a value defined by the following equation:

$$I_{FC}(k) = (SOC_{SP} - S\hat{O}C(k)) * K_{SOC\,reg}$$

where $I_{FC}(k)$ is the fuel cell current, $SOC_{SP}$ is the setpoint, $S\hat{O}C(k)$ is the estimated present state of charge of the battery and $K_{SOC\,reg}$ is a control gain.

7. The method of claim 6, wherein the control gain, $K_{SOC\,reg}$, is defined according to the following equation:

$$K_{SOC\,reg} = \frac{C_c}{SOC\,Ctrl\,Time\,Constant}$$

where
$C_c$ = Battery amp hour rating * 3600 Farads and SOC Ctrl Time Constant is a time constant in seconds.

8. The method of claim 7, wherein the calculated fuel cell current is coerced between a minimum fuel cell current value and a maximum fuel cell current value.

9. The method of claim 1, wherein the observer gain is calculated using a method chosen from pole placement or Kalman filtering.

10. The method according to claim 1, further comprising coercing the calculated estimated present state of charge of the battery to a value between 0 and 1.

11. The method according to claim 1, wherein the state of charge of the battery is regulated by placing the fuel cell system in idle when the estimated present state of charge of the battery is greater than a threshold high state of charge value.

12. The method according to claim 11, further comprising monitoring an electric load that draws power from the battery while the system is in idle and restarting the fuel cell system when an electric load that draws power from the battery at or above a threshold value is detected.

13. The method according to claim 1, wherein the battery current is measured directly.

14. The method according to claim 1, wherein the battery current is calculated.

15. The method according to claim 1, wherein the battery voltage is measured directly.

16. The method according to claim 1, wherein the battery voltage is sensed by a DC/DC converter connected in series with the fuel cell.

17. The method according to claim 1, wherein the estimated battery voltage $\hat{V}_{bus}(k)$ is defined according to the following equation $$\hat{V}_{bus}(k) = V_{oc} - V_{drop}$$

where $V_{oc}$ is an open circuit voltage of the battery;
$V_{drop}$ is the voltage drop caused by the battery current due to the battery impedance.

18. The method according to claim 17, wherein the voltage drop caused by the battery current due to the battery impedance $V_{drop}$ is defined according to the following equation:

$$V_{drop} = R_{Series} I_{battery}(k)$$

where $R_{Series}$ is a resistance value chosen to model the impedance of the battery.

19. The method according to claim 1, wherein the battery capacity $C_c$ is defined according to the following equation when $I_{battery}(k)$ is greater than or equal to zero:

$$C_c = 3600 * \text{Battery amp hour rating} * e^{-Discharging\,coeff * I_{battery}(k)}$$

and $C_c$ is calculated according to the following equation when $I_{battery}(k)$ is less than zero:

$$C_c = 3600 * (\text{Battery amp hour rating} - Charging\,coeff * I_{battery}(k)).$$

where the Battery amp hour rating, the Discharging coeff, and the Charging coeff are constants associated with the battery.

20. The method according to claim 17, wherein the open circuit voltage of the battery is calculated according to the following equation:

$$V_{oc} = V_{oc}Slope * S\hat{O}C(k-1) + V_{oc}Offset,$$

where $V_{oc}Slope$ and $V_{oc}offset$ are both constants associated with the battery.

* * * * *